United States Patent
Gan et al.

(10) Patent No.: US 12,002,795 B2
(45) Date of Patent: Jun. 4, 2024

(54) PLUGGABLE CPU MODULES WITH VERTICAL POWER

(71) Applicant: Google LLC, Mountain View, CA (US)

(72) Inventors: Houle Gan, Santa Clara, CA (US); Richard Stuart Roy, Mountain View, CA (US); Yujeong Shim, Cupertino, CA (US); William F. Edwards, Jr., Livermore, CA (US); Chenhao Nan, Santa Clara, CA (US)

(73) Assignee: Google LLC, Mountain View, CA (US)

( * ) Notice: Subject to any disclaimer, the term of this patent is extended or adjusted under 35 U.S.C. 154(b) by 93 days.

(21) Appl. No.: 17/719,857

(22) Filed: Apr. 13, 2022

(65) Prior Publication Data

US 2023/0335541 A1  Oct. 19, 2023

(51) Int. Cl.
*H05K 1/11* (2006.01)
*H01L 25/16* (2023.01)
(Continued)

(52) U.S. Cl.
CPC .............. *H01L 25/162* (2013.01); *H05K 1/11* (2013.01); *H05K 1/183* (2013.01); *H01L 24/16* (2013.01); *H01L 2224/16225* (2013.01); *H05K 2201/10015* (2013.01); *H05K 2201/1003* (2013.01); *H05K 2201/10159* (2013.01); *H05K 2201/10166* (2013.01); *H05K 2201/1053* (2013.01); *H05K 2201/10704* (2013.01); *H05K 2201/10719* (2013.01)

(58) Field of Classification Search
CPC ......... H05K 1/0231–0234; H05K 1/11; H05K 1/141; H05K 1/144–148; H05K 1/18; H05K 1/184–188; H05K 2201/10166; H05K 2201/1053; H05K 2201/10704; H05K 2201/10719
USPC ........................ 361/760–784, 790, 795, 803; 257/660–730
See application file for complete search history.

(56) References Cited

U.S. PATENT DOCUMENTS 4,631,820 A  12/1986  Harada et al.
5,175,613 A  12/1992  Barker, III et al.
(Continued)

FOREIGN PATENT DOCUMENTS

CN  109618538 B  10/2020
DE  19816794 A1  10/1999
(Continued)

OTHER PUBLICATIONS

Multi-layered power module for vertical power delivery applications, Technical Disclosure Commons, (May 6, 2019), pp. 6, https://www.tdcommons.org/dpubs_series/2172.
(Continued)

*Primary Examiner* — Tuan T Dinh
(74) *Attorney, Agent, or Firm* — Lerner David LLP

(57) ABSTRACT

A pluggable processor module includes a microprocessor package, a voltage regulator including a capacitor board, and contacts that each include a first side in contact with the microprocessor package and a second side in contact with the capacitor board. An assembly includes the pluggable processor module and a printed circuit board assembly ("PCBA") including a module aperture that is large enough to receive the power board and narrower than the capacitor board.

19 Claims, 5 Drawing Sheets

(51) Int. Cl.
*H05K 1/18* (2006.01)
*H01L 23/00* (2006.01)

(56) References Cited

U.S. PATENT DOCUMENTS

| | | | |
|---|---|---|---|
| 5,481,436 A | 1/1996 | Werther | |
| 5,497,031 A | 3/1996 | Kozono | |
| 5,608,262 A | 3/1997 | Degani et al. | |
| 5,886,408 A | 3/1999 | Ohki et al. | |
| 5,998,241 A | 12/1999 | Niwa | |
| 6,069,023 A | 5/2000 | Bernier et al. | |
| 6,154,371 A | 11/2000 | Oba et al. | |
| 6,297,964 B1 | 10/2001 | Hashimoto | |
| 6,356,448 B1 * | 3/2002 | DiBene, II | H01R 12/52 257/713 |
| 6,489,669 B2 | 12/2002 | Shimada et al. | |
| 6,518,666 B1 | 2/2003 | Ikeda | |
| 6,611,435 B2 * | 8/2003 | Kumar | H05K 1/0262 713/300 |
| 6,741,480 B2 * | 5/2004 | Hartke | H01L 23/427 257/E23.09 |
| 6,760,232 B2 * | 7/2004 | Smith | H01L 24/17 361/780 |
| 7,085,143 B1 | 8/2006 | Dyckman et al. | |
| 7,095,619 B2 * | 8/2006 | Panella | H05K 1/0262 361/764 |
| 7,180,165 B2 | 2/2007 | Ellsberry et al. | |
| 7,247,932 B1 | 7/2007 | Lin et al. | |
| 7,476,978 B2 | 1/2009 | Otremba | |
| 7,773,390 B2 | 8/2010 | Weir et al. | |
| 7,881,072 B2 * | 2/2011 | Dibene, II | H01R 12/52 361/784 |
| 7,886,431 B2 | 2/2011 | Weir et al. | |
| 8,426,888 B2 | 4/2013 | Molin et al. | |
| 8,513,798 B2 | 8/2013 | Otremba | |
| 8,659,909 B2 * | 2/2014 | Searls | H05K 1/0262 361/783 |
| 8,837,159 B1 | 9/2014 | Buuck | |
| 9,041,070 B2 | 5/2015 | Eguchi et al. | |
| 10,312,361 B2 | 6/2019 | Chowdhury et al. | |
| 11,006,514 B2 | 5/2021 | Go et al. | |
| 11,129,314 B2 | 9/2021 | Grober et al. | |
| 11,452,246 B2 * | 9/2022 | Paynter | H01L 21/6835 |
| 2002/0149098 A1 | 10/2002 | Seyama et al. | |
| 2003/0156400 A1 | 8/2003 | Dibene et al. | |
| 2004/0021212 A1 | 2/2004 | Hamaguchi et al. | |
| 2004/0090755 A1 | 5/2004 | Yatsu | |
| 2004/0183193 A1 * | 9/2004 | Koide | H01L 23/50 257/E23.079 |
| 2004/0203260 A1 | 10/2004 | Block et al. | |
| 2005/0127484 A1 | 6/2005 | Wills | |
| 2005/0231929 A1 | 10/2005 | Morita et al. | |
| 2007/0063324 A1 | 3/2007 | Mishiro et al. | |
| 2008/0116589 A1 | 5/2008 | Li et al. | |
| 2013/0021769 A1 | 1/2013 | Fukuzono | |
| 2018/0331081 A1 * | 11/2018 | Goh | H05K 3/303 |
| 2019/0098802 A1 * | 3/2019 | Mokler | H05K 9/0028 |
| 2020/0066621 A1 * | 2/2020 | Liu | H01L 25/03 |
| 2020/0373260 A1 * | 11/2020 | Hovis | H05K 1/141 |
| 2022/0093536 A1 * | 3/2022 | Bharath | H01L 23/645 |

FOREIGN PATENT DOCUMENTS

| | | |
|---|---|---|
| EP | 2627160 A1 | 8/2013 |
| JP | H047865 A | 1/1992 |
| JP | H08274214 A | 10/1996 |
| JP | 2001308258 A | 11/2001 |
| JP | 4609435 B2 | 1/2011 |
| KR | 100258350 B1 | 6/2000 |
| WO | 2000004595 A2 | 1/2000 |
| WO | 2005079125 A1 | 8/2005 |

OTHER PUBLICATIONS

"Innovating Power Module Packaging" Issue 2, 2021, Power Electronics Europe, 3 pages.
"OCPREG19—Open Accelerator Infrastructure Overview—YouTube" [online] [retrieved Aug. 17, 2022]. Retrieved from the internet: https://www.youtube.com/watch?v=p0H5Z0S1YdY.
Extended European Search Report for European Patent Application No. 22206401.6 dated Sep. 14, 2023. 8 pages.

* cited by examiner

PLUGGABLE CPU MODULES WITH VERTICAL POWER

BACKGROUND

Vertical power arrangements meet the growing power demands of modern processors by mitigating power loss and delay. Typical vertical power arrangements include a voltage regulator bonded to an underside of a board directly under a powered component, such as a processor, on the top side of the board. The location of the voltage regulator directly on the opposite side of the board from the powered component enables a shorter power delivery path than some other arrangements where the voltage regulator is located on the same side of the board as the powered component. Power loss and delay tend to improve as the power delivery path gets shorter.

These arrangements typically require two separate reflow steps to connect the voltage regulator and the component to the board. Changing or reconfiguring the voltage regulator or component may then require heating the board again, which may have unintended effects on elements that do not need to be reconfigured. Installing voltage regulators and processors this way can also result in warpage of the board, particularly where multiple pairs of voltage regulators and processors are installed on the same board.

BRIEF SUMMARY

Vertical power arrangements can be improved by further shortening the power delivery path, reducing the difficulty of installing and replacing components, or both. Aspects of this disclosure are directed to a module that contains a microprocessor package, such as a central processing unit ("CPU") package, and a voltage regulator in a self-contained vertical power arrangement. The microprocessor package may be bonded or otherwise electrically connected directly to the voltage regulator, thereby minimizing the power delivery path.

Further aspects of this disclosure are directed to a motherboard or other printed circuit board assembly ("PCBA") adapted for use with the module. The PCBA may include an aperture configured to receive the module and to enable simple connection of a power supply to the module when the module is installed in the aperture. The elements of the module may also be configured to support the module stably in the aperture. The PCBA may include an electronic communication interface in or near the aperture, and the module may include a corresponding interface configured for engaging with the PCBA's interface when the module is installed in the aperture. Thus, the module may be easily installed in and removed from the PCBA, meaning the module and the PCBA can each be replaced or reconfigured independently from the other. PCBAs may be provided with multiple apertures for multiple modules, and individual modules may be replaced without affecting the others. Multiple modules and multiple PCBAs may be kept on hand to replace failed parts as necessary. Modules may be customized as necessary for specific applications, then used with non-customized PCBAs. In other applications, PCBAs may be customized and used with non-customized modules.

In another aspect, A pluggable processor module may comprise a central processing unit ("CPU") package, a voltage regulator including a capacitor board, and a contact that includes a first side in contact with the microprocessor package and a second side in contact with the capacitor board.

In some arrangements according to any of the foregoing, the contact may be monolithic.

In some arrangements according to any of the foregoing, the capacitor board may be wider than the microprocessor package.

In some arrangements according to any of the foregoing, the capacitor board may include an electronic communication interface on a side that faces away from the microprocessor package.

In some arrangements according to any of the foregoing, the voltage regulator may comprise a power board and conductive pillars electrically connecting the capacitor board to the power board.

In some arrangements according to any of the foregoing, the capacitor board may include a bolt hole and a conductive line extending from the bolt hole to one of the conductive pillars.

In some arrangements according to any of the foregoing, the voltage regulator may include inductors extending through the power board and transistors on a side of the power board facing away from the capacitor board.

In another aspect, an assembly may comprise a pluggable processor module. The pluggable processor module may comprise a microprocessor package, a voltage regulator including a capacitor board, a power board, and conductive pillars connecting the capacitor board to the power board, and a contact that includes a first side in contact with the microprocessor package and a second side in contact with the capacitor board. The assembly may also comprise a PCBA that may include a module aperture that is large enough to receive the power board and narrower than the capacitor board.

In some arrangements according to any of the foregoing, the PCBA may include a first electronic communication interface and the voltage regulator includes a second electronic communication interface configured to align with the first electronic communication interface when the power board is received in the module aperture.

In some arrangements according to any of the foregoing, the first electronic communication interface may be adjacent to the module aperture and the second electronic communication interface may be on a side of the capacitor board that faces away from the microprocessor package.

In some arrangements according to any of the foregoing, the second electronic communication interface may be a land grid array or a pin grid array.

In some arrangements according to any of the foregoing, the PCBA may include a memory aperture in electronic communication with the first electronic communication interface.

In some arrangements according to any of the foregoing, the PCBA may be configured to supply power to the first electronic communication interface.

In some arrangements according to any of the foregoing, the PCBA may include a first bolt hole and the capacitor board includes a second bolt hole located to be alignable with the first bolt hole when the power board is received in the module aperture.

In some arrangements according to any of the foregoing, the PCBA may be configured to supply voltage to the first bolt hole and the capacitor board may include a conductive line extending from the second bolt hole to one of the conductive pillars.

In some arrangements according to any of the foregoing, the capacitor board may be wider than the microprocessor package.

In some arrangements according to any of the foregoing, the module may be among a plurality of pluggable processor modules each including a microprocessor package and a voltage regulator that includes a power board receivable in the module aperture.

In some arrangements according to any of the foregoing, wherein the module aperture may be a first module aperture and the PCBA may include a second module aperture that is large enough to receive the power board and narrower than the capacitor board.

In some arrangements according to any of the foregoing, the module aperture may be a hole extending through the PCBA from a first side of the PCBA to a second side of the PCBA.

In another aspect, a method may comprise plugging a pluggable processor module into a module aperture of a PCBA. The pluggable processor module may comprise a microprocessor package, a voltage regulator including a capacitor board, a power board, and conductive pillars connecting the capacitor board to the power board, and a contact that includes a first side in contact with the microprocessor package and a second side in contact with the capacitor board. The method may also comprise plugging the pluggable processor module into the module aperture may include inserting a portion of the voltage regulator into the module aperture and placing an electronic communication interface of the PCBA in contact with an electronic communication interface of the pluggable processor module.

DETAILED DESCRIPTION

All directional terms, such as "up," "down," "above," "below," "vertical," or "height" used in the following description refer only to the orientation of features as depicted in the figure being described. Such directional terms are not intended to suggest that any features of the devices described herein must exist in any particular orientation when constructed.

Figure 1:
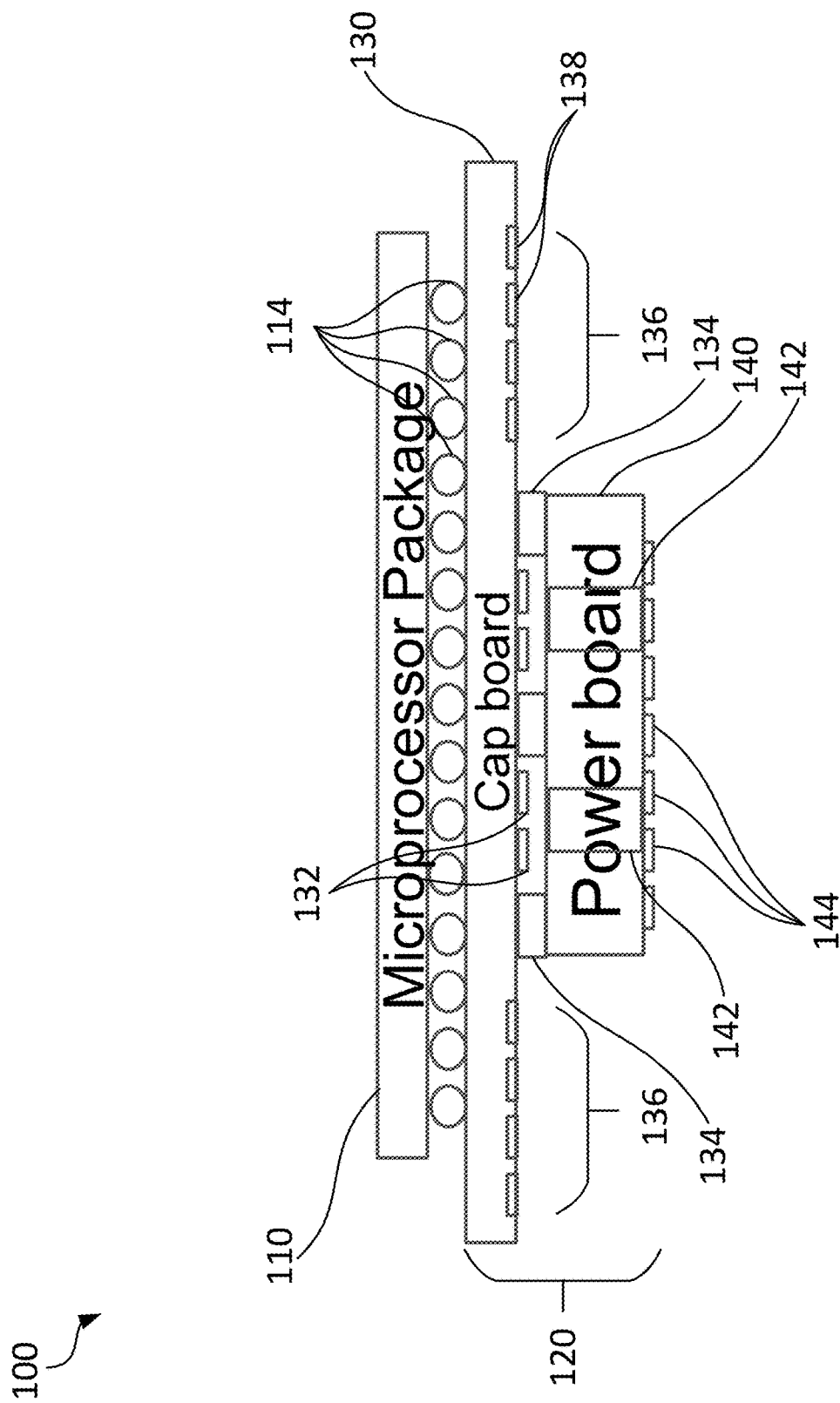
FIG. 1 is a side elevation view of a pluggable module.

FIG. 1 shows a module 100 that includes a microprocessor package 110 and a voltage regulator 120 joined to microprocessor package 110. microprocessor package 110 includes at least a processor die and contacts. The microprocessor package can contain any type of processor, such as, for example, central processing unit ("CPU"), graphics processing unit ("GPU"), tensor processing unit ("TPU"), or any other type of processing unit which may generically be referred to as an "xPU." Microprocessor package 110 could be an application specific integrated circuit ("ASIC"). With respect to every reference to a microprocessor package in the present disclosure, the microprocessor package may optionally be an ASIC, and other arrangements are contemplated wherein an ASIC not containing a microprocessor could be used instead of the microprocessor package.

Module 100 also includes contacts 114 that each have a first side that contacts microprocessor package 110 and a second side that contacts voltage regulator 120. Contacts 114 may each be monolithic. Contacts 114 may be any electrically conductive elements suitable for connecting microprocessor package 110 and voltage regulator 120 together, such as, for example, pillars, solder balls, such as in a ball grid array, or fasteners. In implementations wherein contacts 114 are electrically conductive, contacts pads 114 may provide electrical connections between microprocessor package 110 and voltage regulator 120 in addition to mechanically joining microprocessor package 110 to voltage regulator 120. In other examples, module 100 may include wires or other features for establishing electrical connection between microprocessor package 110 and voltage regulator 120. The direct connection of voltage regulator 120 to microprocessor package 110 by contacts pads 114 as shown in the illustrated example avoids the delay and loss of power supplied to microprocessor package 110 by voltage regulator 120 that can occur in systems wherein a voltage regulator is separated from a microprocessor package by a PCBA or other substrates across which the power supply must travel.

Voltage regulator 120 according to the illustrated example has a vertical power configuration and includes a capacitor board 130, a power board 140, and conductive pillars 134 connecting and establishing electrical contact between capacitor board 130 and power board 140. Capacitor board 130 may be a high density interconnect ("HDI") capacitor board. Conductive pillars 134 could be, for example, copper pillars, solder, a ball grid array, or any other electrically conductive elements suitable for connecting two boards together. Power board 140 may include inductors 142 that extend through a thickness of power board 140 as shown in the illustrated example. Voltage regulator 120 according to the illustrated example also includes transistors 144, such as, for example, field effect transistors or metal-oxide-semiconductor field effect transistors, on an underside of power board 140 that faces away from capacitor board 130. Voltage regulator 120 according to the illustrated example further includes capacitors 132 on an underside of capacitor board 130 that faces toward power board 140. In other examples, the foregoing elements of voltage regulator 120 could be rearranged and some such elements could be omitted. For example, inductors 142 in other arrangements may extend through only part of the thickness of power board 140, capacitors 132 in other arrangements may be located elsewhere on or in capacitor board 130, and transistors 144 in other arrangements may be located elsewhere on or in power board 140.

Module 100 also includes an electronic communication interface 136 for enabling electronic communication between module 100 and printed circuit board assemblies ("PCBAs") such as motherboards or other devices in which module 100 may be installed. Electronic communication interface 136 may be, for example, a land grid array ("LGA"), a pin grid array ("PGA"), or any other type of interface capable of creating an electronic connection across which data may be communicated. In the illustrated example, communication interface 136 is located on the underside of capacitor board 130, facing away from microprocessor package 110 and toward power board 140 and surrounding power board 140 in a rectangular shape. In various other examples, communication interface 136 could be located on side surfaces or a top surface of capacitor board 130 or on any surface of power board 140. In further examples, communication interface 136 could be located on any surface of microprocessor package 110 instead of or in addition to being located on an element of voltage regulator 120. In variations on any of the foregoing, module 110 could include multiple electronic communication interfaces 136 of the same type or of multiple different types.

Figure 2:
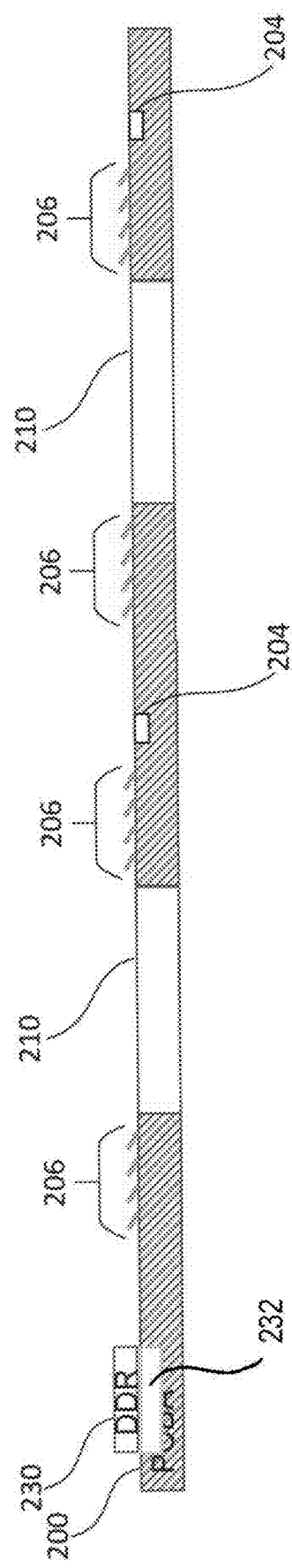
FIG. 2 is a cross-sectional view of a printed circuit board assembly ("PCBA") adapted for use with the module of FIG. 1.

FIG. 2 shows a printed circuit board assembly ("PCBA") 200, such as, for example, a motherboard, or any other type of PCBA, configured for use with module 100. PCBA 210 includes first and second apertures 210 into each of which at least part of module 100 may be inserted. Two apertures 210 are shown, but PCBA 200 may include any number of apertures 210. In the illustrated example, apertures 210 are each an opening that extends through and entire thickness of PCBA 200, but in other examples apertures 210 may extend through less than the entire thickness of PCBA 200. PCBA 200 according to the illustrated example includes an internally threaded bolt hole 204 to facilitate fastening module 100 to PCBA 200, but internally threaded bolt hole 204 may be omitted in other arrangements. In the illustrated example, PCBA 200 further includes a memory aperture 232.

PCBA 200 also includes electronic communication interface 206 extending around aperture 210 in a rectangular shape and matched to communication interface 136 of module 100. Communication interface 206 defines a flat socket on the top surface of PCBA 200 for operative engagement with module 100. For example, in implementations where communication interface 136 of module 100 is an LGA, communication interface 206 of PCBA 200 is a group of pins or other contacts configured for contacting the lands of the LGA, and in other implementations where communication interface 136 of module is a PGA, communication interface 206 of PCBA 200 may be a group of contacts configured for receiving the pins of the PGA. In the same manner that modules 100 other than the illustrated example may have communication interfaces 136 in other locations and quantities and of various types, PCBAs 200 other than the illustrated example may have communication interfaces 136 in locations, quantities, and types as necessary to engage with some or all of the communication interfaces 136 of any variation of module 100.

Various other components may be mounted to PCBA 200, such as, for example, memory 230. Memory 230 may be, for example, random access memory ("RAM"), and in more specific examples double data rate RAM of any generation. A single memory 230 is shown mounted to PCBA 200 for illustrative purposes, but multiple memory components may be mounted to PCBA 200, and other types of computer hardware may be mounted to PCBA 200 instead of or in addition to memory 230.

Figure 3:
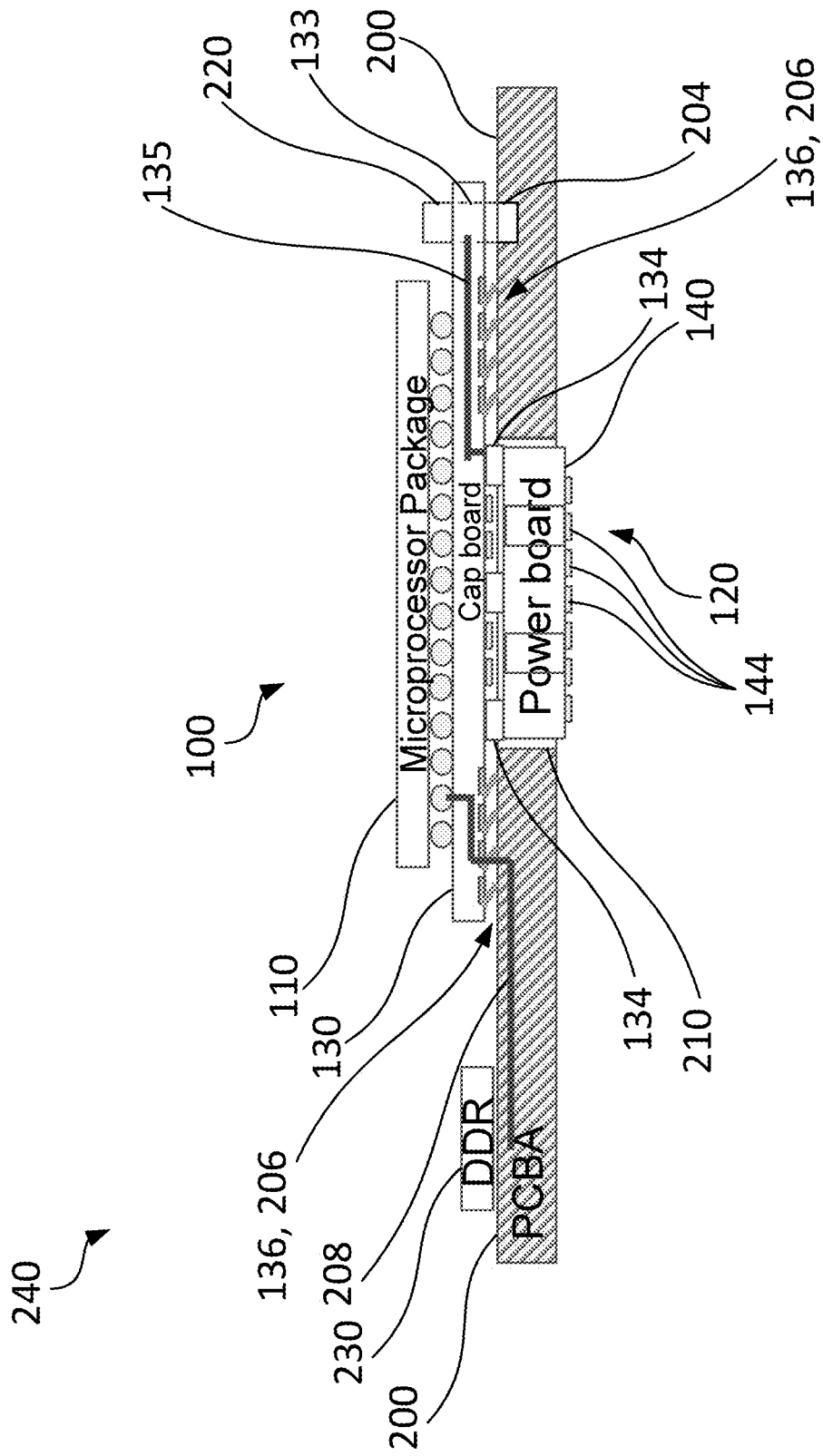
FIG. 3 is a partial cross-sectional view of an assembly of the pluggable module of FIG. 1 and the PCBA of FIG. 2.

FIG. 3 shows an assembly 240 created by inserting module 100 into aperture 210 such that the communication interfaces 136, 206 are engaged to one another to create a data connection 208 between module 100 and PCBA 200. Data connection 208 enables electronic communication between microprocessor package 110 and other components mounted to PCBA 200, such as memory 230.

Where aperture 210 extends through the entire thickness of PCBA 200 as shown in the illustrated example, the underside of power board 140 is accessible from below PCBA 200. Connections to a power source can therefore be made directly to the underside of voltage regulator 120, meaning module 100 and PCBA 200 can be used with power supply arrangements similar to those used with other vertical power arrangements. In other implementations, including implementations where aperture 210 does not extend through the entire thickness of PCBA 200, power connections may extend through PCBA 200 into aperture 210 to supply power to voltage regulator 120 when module 100 is installed in aperture 210.

In the illustrated example of assembly 240, module 100 is fastened to PCBA 200 by a bolt 220 disposed through a bolt hole 133 through capacitor board 130 and threadedly engaged with bolt hole 204 in PCBA 200, though in other examples bolt 220 and bolt holes 133, 204 may be omitted. Bolt hole 133 in capacitor board 130 is alignable with bolt hole 204 in PCBA 200 when module 100 is installed in aperture 210 to enable bolt 220 to extend through both bolt holes 133, 204. In the illustrated example, a conductive line 135 extends from bolt hole 204 of capacitor board 130 to at least one of the pillars 134 so that power can be supplied to or from power board 140 through bolt 220 via electrical contacts provided in bolt hole 204. However, power line 135 may be omitted in other examples.

In assembly 240, power board 140 is received in aperture 210 while capacitor board 130 and microprocessor package 110 sit atop PCBA 200. Capacitor board 130 is laterally wider than aperture 210 on at least one axis that is horizontal from the perspective of FIG. 3, and in some examples capacitor board 130 is wider than aperture 210 on two perpendicular axes that are horizontal from the perspective of FIG. 3. Capacitor board 130 can therefore support module 100 on top of PCBA 200 while power board 140 is received in aperture 210. Thus, when module 100 is installed in aperture 210 with communication interfaces 136, 206 in engagement as shown, power board 140 is received in aperture 210 while capacitor board 130 and microprocessor package 110 remain outside of aperture 210. In various other configurations, module 100 and PCBA 200 may be configured such that, when module 100 is installed in aperture 210 with communication interfaces 136, 206 in engagement, aperture 210 may receive part or all of capacitor board 130 instead of or in addition to power board 140, the entire voltage regulator 120 may be received in aperture 210, or part or all of microprocessor package 110 may be received in aperture 210 instead of or in addition to some or all of voltage regulator 120. In any case, module 100 may be plugged into aperture 210.

The cooperative pluggable design of module 100 and PCBA 200 avoids some of the warpage that can result from bonding a microprocessor package and a voltage regulator to opposite sides of a board in a clamshell arrangement. The freedom to plug and unplug module 100 in aperture 210 also avoids the solder reflow steps usually involved in bonding microprocessor packages and voltage regulators to boards with solder.

PCBAs 200 designed for use with pluggable modules 100 can also remain in use as modules 100 fail or otherwise need to be replaced, since old modules 100 can simply be removed without the need to melt or break solder or other bonds between PCBA 200 and components of module 200. In other examples, modules 100 can be easily reused in different PCBAs 200. Multiple modules 100, PCBAs 200, or both may be kept on hand to facilitate ease of replacement for either part.

The interchangeability of modules 100 and PCBAs 200 can simplify and reduce the cost of designing hardware for new applications. For example, application specific integrated circuits can be created by creating a custom PCBA 200 designed for a particular need and plugging in modules 100 suitable for use in other applications. In other examples, unique modules 100 could be designed to meet the needs of a specific application and plugged into a PCBA 200 suitable for use in other applications.

Figure 4:
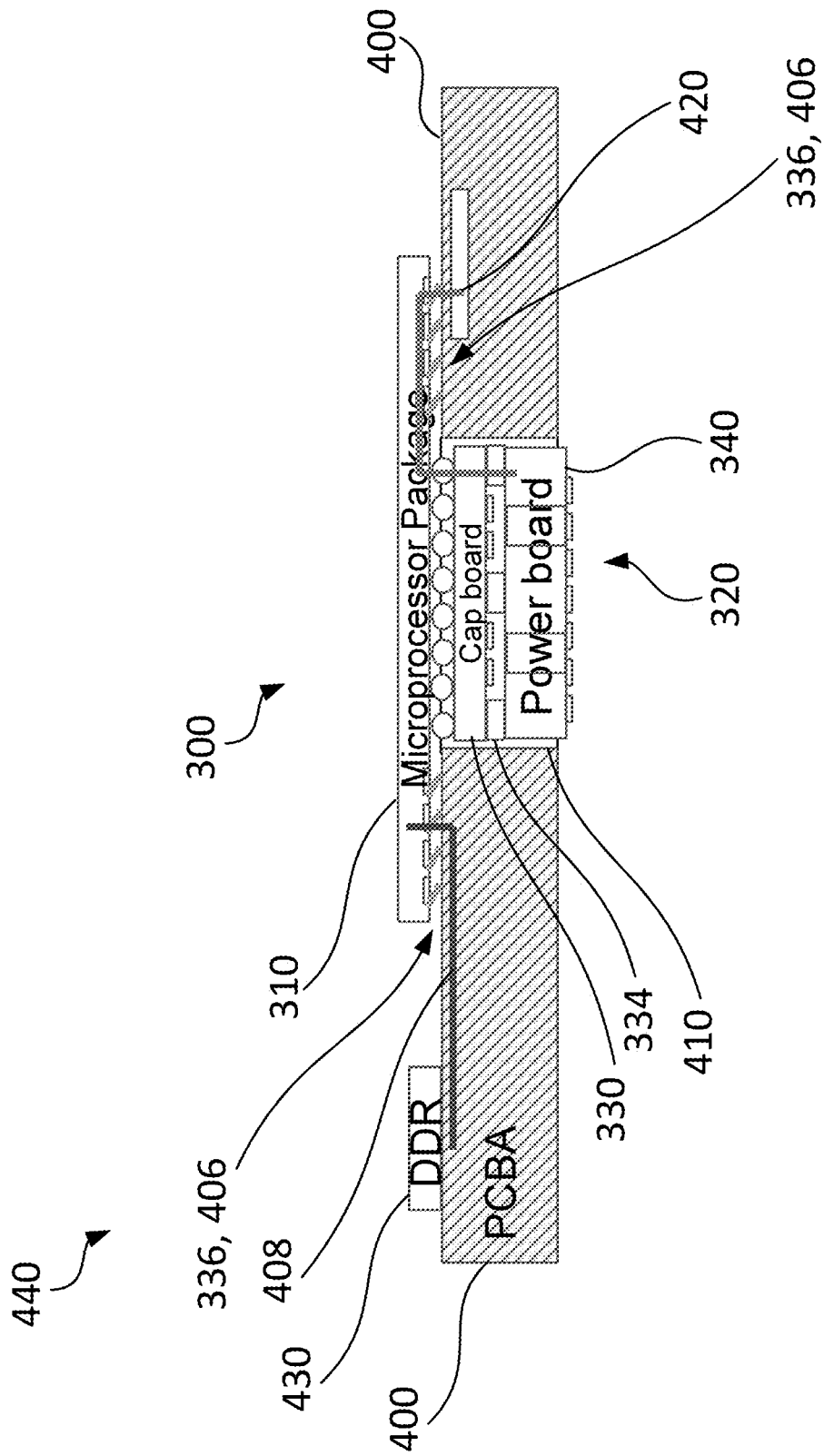
FIG. 4 is a partial cross-sectional view of an assembly of a pluggable module and a PCBA according to another aspect of the present disclosure.

FIG. 4 shows an assembly 440 according to another example. Assembly 440 includes a module 300 and a PCBA 400. Features shown in FIG. 4 in the 300 and 400 series are alike to like numbered elements in the 100 and 200 series, respectively, shown in FIGS. 1-3 except for specifically illustrated or stated differences. Accordingly, module 300, microprocessor package 310, and voltage regulator 320 are generally similar to module 100, microprocessor package 110, and voltage regulator 120, while PCBA 400 and aperture 410 are generally similar to PCBA 200 and aperture 210.

Module 300 differs from module 100 in that capacitor board 330 is horizontally narrow enough to be received in aperture 410 so that the entirety of voltage regulator 320, which includes both power board 340 and capacitor board 330, can be inserted into aperture 410 as shown in FIG. 4. Electronic communication interfaces 336 for module 300 are located on an underside of microprocessor package 310 to engage electronic communication interfaces 406 on top of PCBA 400 when module 300 is installed in aperture 410. Installing module 300 in aperture 410 can therefore create a data connection 408 between microprocessor package 310 and other components on PCBA 400, such as memory 430. A power supply connection 420 may be provided at or near an edge of aperture 410 to supply power to voltage regulator 320 through communication interfaces 336, 406 and microprocessor package 310. Though not illustrated in FIG. 2 or 3, a similar power supply connection could be provided at an edge of aperture 210 of PCBA 200 instead of or in addition to the power supply through bolt 220.

Figure 5:
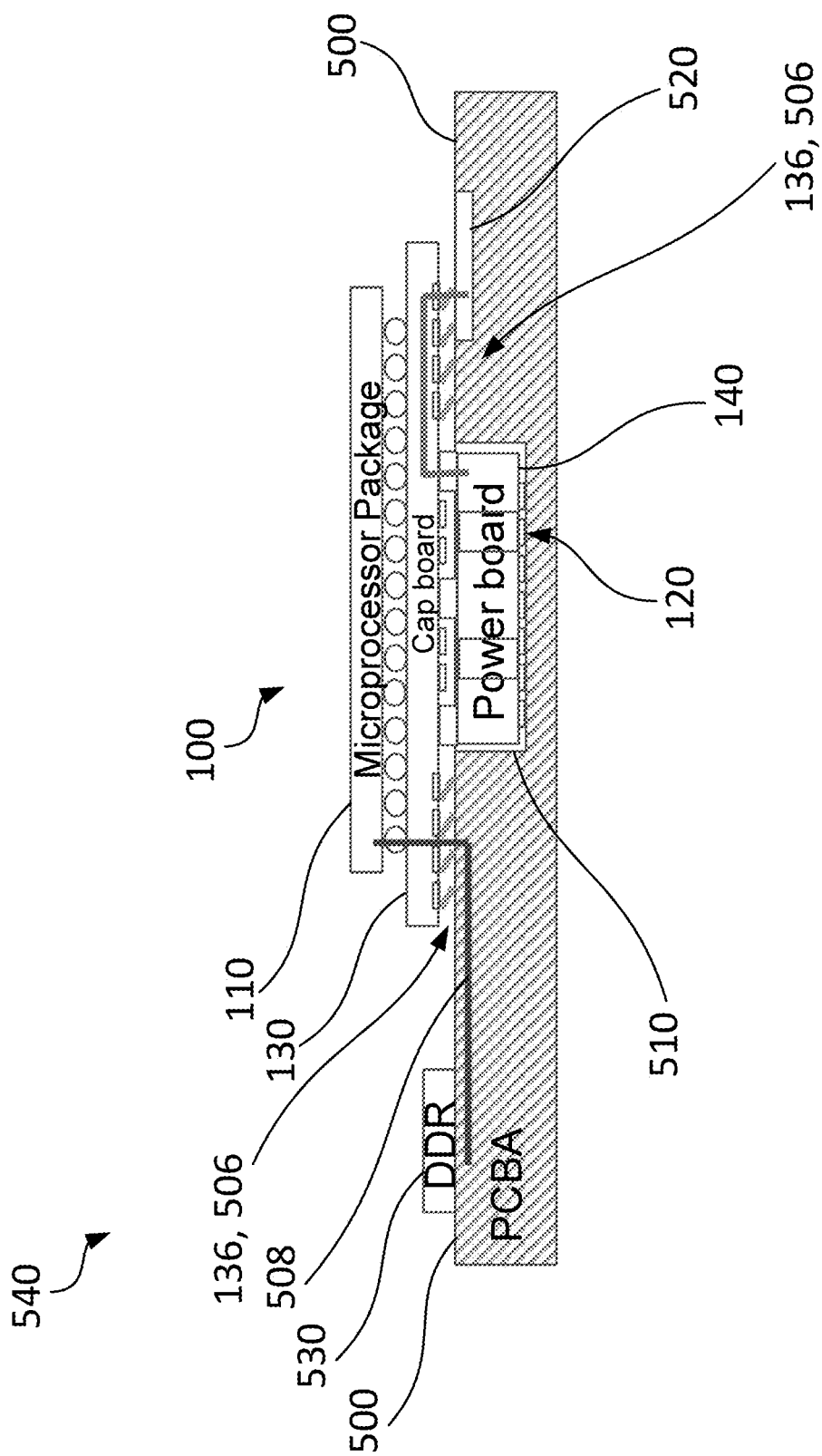
FIG. 5 is a partial cross-sectional view of an assembly of the pluggable module of FIG. 1 and a PCBA according to another aspect of the present disclosure.

FIG. 5 shows an assembly 540 according to another example. Assembly 540 includes module 100 and a PCBA 500. Features shown in FIG. 5 in the 500 series are alike to like numbered elements in the 200 series shown in FIGS. 1-3 except for specifically illustrated or stated differences. Accordingly, PCBA 500 and aperture 510 are generally similar to PCBA 200 and aperture 210.

PCBA 500 differs from PCBA 200 in that aperture 210 does not extend through an entire thickness of PCBA 500. PCBA 500 is otherwise generally similar to PCBA 200, including electronic communication interface 506 adjacent aperture 510 for providing a data connection 508 between microprocessor package 110 and other components installed on PCBA 500, such as memory 530. PCBA 500 according to the illustrated example includes a power supply connection 520 at or near an edge of aperture 510 for providing power to voltage regulator 120 through interfaces 136, 506. However, in other examples, PCBA 500 could be provided with a bolt hole and bolt similar to bolt hole 204 and bolt 220 to power voltage regulator 120 instead of or in addition to power supply connection 520.

Although the concept herein has been described with reference to particular examples, it is to be understood that these examples are merely illustrative of the principles and applications of the present concept. It is therefore to be understood that numerous modifications may be made to the illustrative examples and that other arrangements may be devised without departing from the spirit and scope of the present concept as defined by the appended claims.

The invention claimed is:

1. An assembly comprising:
 a pluggable processor module comprising:
  a microprocessor package;
  a voltage regulator including a capacitor board, a power board, and conductive pillars connecting the capacitor board to the power board; and
  a contact that includes a first side in contact with the microprocessor package and a second side in contact with the capacitor board; and
 a printed circuit board assembly ("PCBA") including a module aperture that is large enough to receive the power board and narrower than the capacitor board.

2. The assembly of claim 1, the contact is monolithic.

3. The assembly of claim 1, wherein the capacitor board is wider than the microprocessor package.

4. The assembly of claim 1, wherein the capacitor board includes an electronic communication interface on a side that faces away from the microprocessor package.

5. The assembly of claim 1, wherein the voltage regulator comprises a power board and conductive pillars electrically connecting the capacitor board to the power board.

6. The assembly of claim 1, wherein the PCBA includes a first electronic communication interface and the voltage regulator includes a second electronic communication interface configured to align with the first electronic communication interface when the power board is received in the module aperture.

7. The assembly of claim 1, wherein the PCBA includes a first bolt hole and the capacitor board includes a second bolt hole located to be alignable with the first bolt hole when the power board is received in the module aperture.

8. The assembly of claim 1, wherein the capacitor board is wider than the microprocessor package.

9. The assembly of claim 1, wherein the module is among a plurality of pluggable processor modules each including a microprocessor package and a voltage regulator that includes a power board receivable in the module aperture.

10. The assembly of claim 1, wherein the module aperture is a first module aperture and the PCBA includes a second module aperture that is large enough to receive the power board and narrower than the capacitor board.

11. The assembly of claim 1, wherein the module aperture is a hole extending through the PCBA from a first side of the PCBA to a second side of the PCBA.

12. The assembly of claim 5, wherein the capacitor board includes a bolt hole and a conductive line extending from the bolt hole to one of the conductive pillars.

13. The assembly of claim 5, wherein the voltage regulator includes inductors extending through the power board and transistors on a side of the power board facing away from the capacitor board.

14. The assembly of claim 6, wherein the first electronic communication interface is adjacent to the module aperture and the second electronic communication interface is on a side of the capacitor board that faces away from the microprocessor package.

15. The assembly of claim 6, wherein the second electronic communication interface is a land grid array or a pin grid array.

16. The assembly of claim 6, wherein the PCBA includes a memory aperture in electronic communication with the first electronic communication interface.

17. The assembly of claim 6, wherein the PCBA is configured to supply power to the first electronic communication interface.

18. The assembly of claim 7, wherein the PCBA is configured to supply voltage to the first bolt hole and the capacitor board includes a conductive line extending from the second bolt hole to one of the conductive pillars.

19. A method comprising plugging a pluggable processor module into a module aperture of a PCBA, wherein:
 the pluggable processor module comprises:
  a microprocessor package;

a voltage regulator including a capacitor board, a power board, and conductive pillars connecting the capacitor board to the power board; and a contact that includes a first side in contact with the microprocessor package and a second side in contact with the capacitor board; and plugging the pluggable processor module into the module aperture includes inserting a portion of the voltage regulator into the module aperture and placing an electronic communication interface of the PCBA in contact with an electronic communication interface of the pluggable processor module.

\* \* \* \* \*